US 6,617,568 B1

(12) United States Patent
Matsuda

(10) Patent No.: US 6,617,568 B1
(45) Date of Patent: Sep. 9, 2003

(54) SIDE-FACE INCIDENCE TYPE PHOTO DETECTOR

(75) Inventor: Kenichi Matsuda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/525,837

(22) Filed: Mar. 15, 2000

(30) Foreign Application Priority Data

Mar. 15, 1999 (JP) .............................. 11-069265

(51) Int. Cl.[7] .............................................. H01L 31/00
(52) U.S. Cl. ............................ 250/214.1; 250/214 R; 257/431; 458/48
(58) Field of Search ......................... 250/214.1, 214 R; 257/431–437; 458/48, 54, 65, 69, 70

(56) References Cited

U.S. PATENT DOCUMENTS

| 4,855,802 A | * | 8/1989 | Kato .......................... 257/55 |
| 5,218,223 A | * | 6/1993 | Spaeth et al. ............... 257/436 |
| 5,932,114 A | * | 8/1999 | Makiuchi ..................... 216/24 |
| 6,246,097 B1 | * | 6/2001 | Kato et al. ................... 257/432 |

FOREIGN PATENT DOCUMENTS

| JP | 5-55619 | 3/1993 |
| JP | 8-316506 | 11/1996 |
| JP | 11-307806 | 11/1999 |

\* cited by examiner

*Primary Examiner*—Kevin Pyo
*Assistant Examiner*—Seung C. Sohn
(74) *Attorney, Agent, or Firm*—RatnerPrestia

(57) ABSTRACT

A photo detector includes: a semiconductor substrate having a first principal face and a second principal face; a photo detection area formed on the first principal face of the semiconductor substrate; a negative electrode electrically connected with the photo detection area; a positive electrode; a beveled face formed at least one edge portion of the first principal face of the semiconductor substrate; and a reflector formed on the second principal face of the semiconductor substrate, wherein incident light from outside of the semiconductor substrate, enters the semiconductor substrate at a side face of the photo detector while being refracted at the beveled face, and thereafter is reflected from the reflector so as to reach the photo detection area.

13 Claims, 4 Drawing Sheets

SIDE-FACE INCIDENCE TYPE PHOTO DETECTOR

BACKGROUND OF THE INVENTION

1. Field of the Invention

The present invention relates to a side-face incidence type photo detector in which incident light entering the photo detector from a side direction thereof is refracted and detected at the detection area. The present invention especially relates to a photo detector in which incident light is refracted at beveled face formed on at least one edge portion of a second face of a semiconductor substrate, whereby the light path of the incident light is diverted.

2. Description of the Related Art

For optical fiber communications, photo detectors which are sensitive to light of a long wavelength band of 1.3 μm to 1.55 μm are used. These photo detectors are pin photo diodes formed of a material selected from InGaAs/InP-type semiconductor materials. Such photo detectors are classified based on the direction from which the photo detector receives incident light. Front-face incidence type and rear-face incidence type photo detectors are generally used. In a front-face incidence type photo detector, incident light enters the semiconductor substrate through a face thereof on which the detection area is formed, i.e., a first principal face. In a rear-face incidence type photo detector, incident light enters the detector through a face which is opposite to the first principal face of the semiconductor substrate (i.e., through a second principal face). In such front-face incidence type and rear-face incidence type photo detectors, incident light enters from a direction substantially perpendicular to the semiconductor substrate.

On the other hand, side-face incidence type photo detectors also have been developed in which incident light enters through a side face of the photo detector. Such side-face incidence type photo detectors are especially advantageous over front-face incidence type and rear-face type photo detectors, in the cases where the photo detector is mounted on a base along with other elements. For example, in the case where the photo detector is provided with an optical fiber for supplying incident light, the photo detector is first bonded onto the base of a flat package, and then the optical fiber can be attached along a horizontal direction with regard to the photo detector. In the case where the light exiting from the rear of a semiconductor laser is monitored by a photo detector, the semiconductor laser and a principal face of the photo detector can be bonded onto the same base. In either case, the devices can be easily assembled.

Such side-face incidence type photo detectors have been implemented by employing so-called waveguide type pin photo diodes, or pin photo diodes having a refraction-based light path diversion means within the photo detector, so as to utilize their structural features to refract light entering the semiconductor substrate.

A pin photo diode having a refraction-based light path diversion means is described, for example, in Japanese Laid-open Publication No. 8-316506. FIG. 6 shows a cross-sectional view of such a conventional photo detector 600. With reference to FIG. 6, a conventional photo detector 600 includes on a first principal face 602 of an n-type InP semiconductor substrate 601, an n-type Inp buffer layer 603, a low concentration n-type InGaAs light absorbing layer 604, and a low concentration n-type InP window layer 605 in this order. A first diffusion area 606 is formed in a portion of the window layer 605, by means of diffusing a p-type impurity, e.g., Zn, in an island shape. A portion of the light absorbing layer 604 underlying the first diffusion area 606 functions as a photo detection area 607. The photo detection area 607 is electrically connected to a negative electrode 608 through the first diffusion area 606. The negative electrode 608 is formed on the first diffusion area 606, and a positive electrode 609 is formed on a second diffusion area 610. The second diffusion area 610 is provided to form the positive electrode 609 on the first principal face 602. The second diffusion area 610 is simultaneously formed by the diffusion of p-type impurity when the first diffusion area 606 is formed. Beveled face 612 is formed on at least one edge portion of the second principal face 611 of the semiconductor substrate 601 by an etching process. In a conventional photo detector 600 having such a structure, incident light 613 from the side of the semiconductor substrate 601 is refracted at the beveled face 612, and the refracted light 614 enters the photo detection area 607.

The conventional photo detector 600 is characterized by refracting the incident light 613 at the beveled face 612 so as to divert the light path of the incident light. Japanese Laid-open Publication No. 8-316506 describes that the (111) surface having an angle of 54.7° with regard to the second principal face 611 is preferably used for the beveled face 612. This is because the beveled face 612 is required to have a particular angle with respect to the second principal face 611 as well as to have a smooth surface. In order to ensure that the beveled face 612 on the semiconductor substrate 601 meets such requirements, it is the most convenient to use a wet etching, which exposes a certain crystal face orientation. For manufacturing the photo detector 600, a semiconductor substrate whose principal face is the (001) surface is generally used as the semiconductor substrate 601. When a wet etching for exposing a crystal face orientation is applied to such a semiconductor substrate 601, the (111) surface is often exposed. The resultant beveled face 612 having the (111) surface form an angle of 54.7° with regard to the second principal face 611. The incident light 614 entering the interior of the semiconductor substrate 601 is refracted at such a beveled surface 612 so as to form an angle of 25.7° with regard to the second principal face 611.

As another conventional example, Japanese Laid-open Publication No. 11-307806 describes a pin photo diode having a refraction-based light path diversion means within the photo detector. FIG. 7 shows a cross-sectional view of a second conventional photo detector 700. With reference to FIG. 7, a conventional photo detector 700 includes on the first principal face 702 of an n-type InP semiconductor substrate 701, a low concentration n-type InGaAs light absorbing layer 703, and a low concentration n-type InP window layer 704 in this order. A diffusion area 705 is formed in the window layer 704, by diffusing a p-type impurity, e.g., Zn, in an island shape. A portion of the light absorbing layer 703 underlying the diffusion area 705 functions as a photo detection area 706. The photo detection area 706 is electrically connected to a negative electrode 707 through the diffusion area 705. The negative electrode 707 is formed on the diffusion area 705, and a positive electrode 709 is formed on a second principal face 708 of the semiconductor substrate 701. Beveled face 710 is formed on at least one edge portion of the second principal face 708 of the semiconductor substrate 701. In a conventional photo detector 700 having such a structure, the incident light 711 entering the semiconductor substrate 701 from the side thereof is refracted at the beveled face 710, and the refracted light 712 enters the photo detection area 706.

The conventional photo detector 700 is characterized by using the (112) surface as the beveled face 710. When the beveled face 710 is the (112) surfaces, the beveled face 710 forms an angle of 35.3° with regard to the second principal face 708. The (112) surface can be exposed by an etching using a mixed solution containing hydrochloric acid and nitric acid. Specifically, if the mixed solution for the etching is prepared so as to have an about 5:1 to about 3:1 hydrochloric acid-nitric acid volume ratio, the beveled face 710 may have an angle of exactly 35.3° with regard to the second principal face 708, and may have a specular surface. The incident light 712 entering the interior of the semiconductor substrate 701 is refracted at such a beveled face 710 at an angle of 41.0° with regard to the second principal face 708.

In the photo detector 700 whose beveled face 710 is the (112) surface, the angle between the beveled face 710 and the second principal face 708 is smaller than in the case where the beveled face 612 is the (111) surface (as in the aforementioned photo detector 600), and the distance from the incidence side face to the center of the photo detection area 706 surface becomes shorter. Therefore, it is possible to reduce the chip size of the photo detector 700.

However, in manufacturing the first and second conventional photo detectors 600 and 700, having structures as described with reference to FIG. 6 and FIG. 7, respectively, the beveled face 612 or 710 on the second principal face should be correctly positioned with regard to the photo detection area 607 or 706 on the first principal face. This requires a double-side aligner, which performs a positioning process through visual observation of both faces of a wafer on which the photo detector structure 600 or 700 is to be formed. A double-side aligner, however, is not commonly employed as a manufacturing machine for semiconductor devices. Therefore, additional manufacturing equipment needs to be introduced for producing a photo detector having such a structure, increasing the manufacturing cost of the photo detector.

In order to easily divide the wafer into individual photo detectors (i.e., chips) after the manufacturing process of the wafer, the thickness of the semiconductor substrate is generally maintained as thin as 200 μm or less. In the structure of the aforementioned photo detector 600 or 700 shown in FIG. 6 or FIG. 7, the second principal face needs to be processed so as to form the beveled face 612 or 710, after reducing the thickness of the semiconductor substrate 601 or 701. Specifically, the thin film wafer with a thickness of 200 μm or less is subjected to a photo lithography process so as to form the beveled face 612 or 710 on the second principal face. If a double-side aligner employing a contact exposure method is used in this case, the wafer tends to break and/or crack. This reduces the product yield, again increasing the manufacturing cost.

SUMMARY OF THE INVENTION

In one aspect of the invention, a photo detector includes: a semiconductor substrate having a first principal face and a second principal face; a photo detection area formed on the first principal face of the semiconductor substrate; a negative electrode electrically connected with the photo detection area; a positive electrode; a beveled face formed at least one edge portion of the first principal face of the semiconductor substrate; and a reflector formed on the second principal face of the semiconductor substrate, wherein incident light from outside of the semiconductor substrate, enters the semiconductor substrate at a side face of the photo detector while being refracted at the beveled face, and thereafter is reflected from the reflector so as to reach the photo detection area.

In one embodiment of the invention, the first principal face of the semiconductor substrate is the (001) surface and the beveled face is the (112) surface.

In another embodiment of the invention, the reflector is a reflective mirror including a metal film.

In still another embodiment of the invention, the reflector functions as the positive electrode.

In still another embodiment of the invention, the first principal face of the semiconductor substrate further includes a light absorbing layer formed thereon, a portion of the light absorbing layer functioning as the light detection area.

In still another embodiment of the invention, the light absorbing layer further includes a window layer having a diffusion area, and the photo detection area is electrically connected to the negative electrode through the diffusion area.

In still another embodiment of the invention, a photo detector further includes a contact hole which reaches the first principal face of the semiconductor substrate through the window layer and through the light absorbing layer, wherein the positive electrode makes contact with at least a bottom of the contact hole.

In still another embodiment of the invention, the reflector is a reflective mirror including a laminated structure of a insulating film and a metal film, and the insulating film is disposed between the second principal face and the metal film.

In still another embodiment of the invention, the reflector is a wavelength filter in which a plurality of films having respectively different indices of refraction are laminated.

In still another embodiment of the invention, the reflector is a diffraction grating.

In still another embodiment of the invention, the photo detector includes a plurality of photo detection areas and a plurality of negative electrodes corresponding to the plurality of photo detection areas, respectively.

In another aspect of the invention, a method for manufacturing a photo detector includes the steps of: forming a photo detection area on a first principal face of a semiconductor substrate having the first principal face and a second principal face; forming a negative electrode electrically connected to the photo detection area; forming a positive electrode; forming a beveled face on at least one edge portion of the first principal face of the semiconductor substrate; forming a reflector on the second principle face of the semiconductor substrate.

In one embodiment of the invention, the step of forming the reflector includes a step of forming the positive electrode, and the reflector functions as the positive electrode.

In another embodiment of the invention, a method for manufacturing a photo detector further includes a step of forming a light absorbing layer on the first principal face of the semiconductor substrate, wherein a portion of the light absorbing layer functions as a photo detection area.

In still another embodiment of the invention, a method for manufacturing a photo detector further includes a step of forming a window layer having a diffusion area, wherein the photo detection area is electrically connected to the negative electrode through the diffusion area.

In still another embodiment of the invention, a method for manufacturing a photo detector further includes a step of forming a contact hole reaching the first principal face of the semiconductor substrate through the window layer and through the light absorbing layer, wherein the positive electrode is formed so as to make contact with at least a bottom of the contact hole.

In still another embodiment of the invention, the step of forming a beveled face includes: depositing an insulating film so as to cover the negative electrode: forming an opening in a predetermined area by etching the insulating film,: etching the semiconductor substrate corresponding the predetermined area, by using the insulating film having the opening as a mask; and removing the insulating film.

In still another embodiment of the invention, the step of depositing the insulating film includes a step of depositing the insulating film so as to cover exposed surfaces of the positive electrode and the window layer; and the step of forming the beveled face includes a step of etching the window layer and the light absorbing layer corresponding to the predetermined area.

In still another embodiment of the invention, the semiconductor substrate includes InP.

In still another embodiment of the invention, the first principal face is the (001) surface and the step of forming the beveled face is conducted by etching using a mixed solution containing hydrochloric acid and nitric acid.

In still another embodiment of the invention, the volume ratio of the hydrochloric acid and the nitric acid is in the range of 5:1 to 3:1.

Thus, the invention described herein makes possible the advantage of providing a side incidence type photo detector in which the increase of manufacturing cost is effectively alleviated.

This and other advantages of the present invention will become apparent to those skilled in the art upon reading and understanding the following detailed description with reference to the accompanying figures.

DESCRIPTION OF THE PREFERRED EMBODIMENTS

Hereinafter, Examples of the present invention will be explained with regard to FIGS. 1 through 5.

EXAMPLE 1

Figure 1:
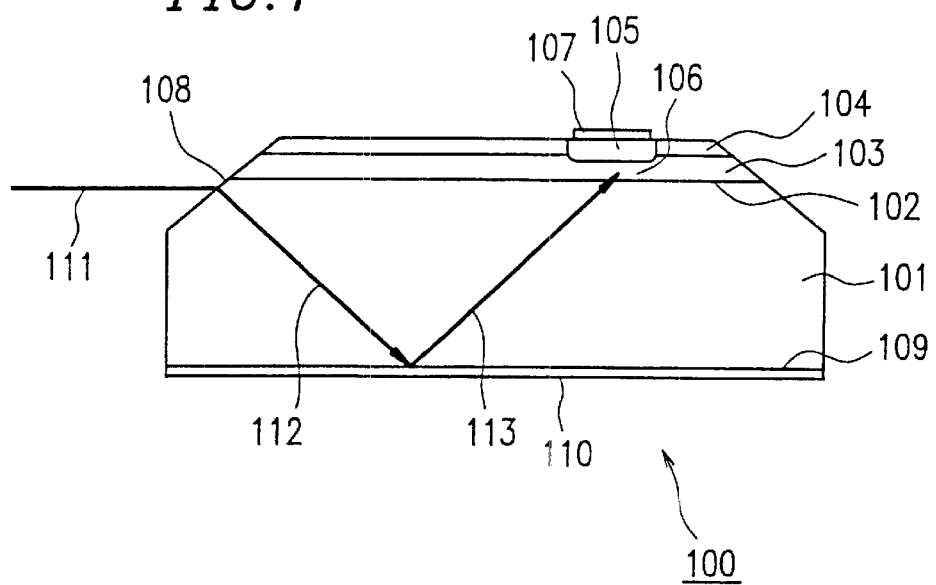
FIG. 1 is a cross-sectional view of a photo detector according to a first example of the present invention.

FIG. 1 shows a cross-sectional view of a photo detector 100 according to Example 1. With reference to FIG. 1, the photo detector 100 includes on a first principal face 102 of an n-type InP semiconductor substrate 101, a low concentration n-type InGaAs light absorbing layer 103, and a low concentration n-type InP window layer 104 in this order. A diffusion area 105 is formed in the window layer 104 by diffusing a p-type impurity, e.g., Zn, in an island shape. A portion of the light absorbing layer 103 underlying the diffusion area 105 functions as a photo detection area 106. The photo detection area 106 is electrically connected to a negative electrode 107 through the diffusion area 105. The negative electrode 107 is formed on the diffusion area 105, and beveled face 108 is formed on at least one edge portion of the first principal face 102 of the semiconductor substrate 101. A reflector 110 is formed on a second principal face 109 of the semiconductor substrate 101. The first principal face 102,of the semiconductor substrate 101 is the (001) surface, and the beveled face 108 is the (112) surface. The reflector 110 is a reflective mirror which is formed by depositing metals such as Au—Sn on the second principal face 109 of the semiconductor substrate 101. The reflector also functions as a positive electrode.

In the photo detector 100 having such a structure, incident light 111 from the outside of the semiconductor substrate 101 is refracted at the beveled face 108 and enters the interior of the semiconductor substrate 101. The refracted light 112 is then reflected from the reflector 110, and the reflected light 113 enters the photo detection area 106.

The photo detector 100 of Example 1 is characterized by refracting the incident light 111 at the beveled face 108 which is formed on the first principal face 102. According to such a structure, the processing of the second principal face 109 and the first principal face 102 does not require relative positioning therebetween, so that it is not necessary to use a double-side aligner.

Further according to the structure of Example 1, the entire surface of the second principal face 109 is covered with the reflector 110, which is made of a metal film. To obtain such a structure, the first principal face 102 which defines the main structure of the photo detector 100 is first formed, and then the thickness of the semiconductor substrate 101 is reduced to about 200 μm or less from the second principal face 109, and finally the second principal face 109 is processed (so as to provide the reflector 110 thereon in this example). As a result, breaks and/or cracks of the thin film wafer during the processing of the second principal face 109 are effectively reduced.

Furthermore, in the case where the first principal face 102 is the (001) surface and the beveled face 108 is the (112) face, the angle formed by the beveled face 108 and the second principal face 109 is smaller compared to the case where the beveled face 108 is the (111) surface. Therefore, the distance from the incidence side face to the center of the photo detection area 106 becomes shorter, thereby reducing the chip size of the photo detector 100. More specifically, in the case where the beveled face 108 is the (112) surface, beveled face 108 and the first principal face 102 form an angle of 35.3°. The incident light 111 refracted at such beveled face 108 and entering the interior of the semiconductor substrate 101 forms an angle of 41.0° with regard to the first principal face 102. In this case, if the thickness of the semiconductor substrate 101 is set to be 150 μm, the horizontal distance that the incident light 111 (the reflected light 113) travels before reaching the first principal face 102 will be 345 μm. Therefore, in the case where the thickness of the semiconductor substrate 101 is about 150 μm, the horizontal distance from the point of incidence of the incident.light 111 on the beveled face 108 to the center of the photo detection area 106 is set to be about 345 μm.

As described above, the reflector 110 of the photo detector 100 in FIG. 1 also functions as the positive electrode. Therefore, when the photo detector 100 is packaged, the photo detector 100 can be bonded to the package by wire bonding. For example, the photo detector 100 may be positioned on the base of a package in such a manner that the second principal face 109 faces the package and the first principal face 102 faces away from the package, and then the reflector (the positive electrode) 110 may be bonded to a predetermined metallic pattern provided on the base of the package for connection with the positive electrode. Then, the negative electrode 107 may be bonded to a predetermined metallic pattern provided on the base of the package for connection with the negative electrode. As the material for the metallic pattern, a metal such as gold is used. In this case, the beveled face 108 is situated on the upper side of the chip on which the photo detector 100 is mounted. Therefore, the distance from the point of incidence (of the incidence light 111) on the beveled face 108 to the base face of the package depends on the thickness of the semiconductor substrate 101. Thus in this case, it is necessary to accurately control the thickness of the semiconductor substrate 101 in order to ensure proper positioning along the height direction.

Alternatively, the photo detector 100 may be positioned on the base face of the package in such a manner that the first principal face 102 faces the package and the second principal face 109 faces away from the package, and then the negative electrode 107 may be die-bonded to a predetermined solder bump formed on the base of the package for connection with the negative electrode. Then, the reflector (the positive electrode) 110 may be wire-bonded to a predetermined metallic pattern formed on the base of the package for connection with the positive electrode. In this case, the beveled face 108 is situated on the lower side of the chip on which the photo detector 100 is mounted. Therefore, the distance from the point of incidence (of the incidence light 111) on the beveled face 108 to the base of the package does not depend on the thickness of the semiconductor substrate 101. This allows the thickness of the semiconductor substrate 101 to be controlled relatively easily. Therefore, in this case, the positioning along the height direction is facilitated. This mounting method is suitable for the case where the optical fiber is attached along a horizontal direction with regard to the photo detector 100 bonded onto the base of the package, or in the case where the light exiting from the rear of a semiconductor laser is monitored by the photo detector 100 bonded onto the same face as the semiconductor laser is provided on.

The material used for the semiconductor substrate 101 and the semiconductor layers deposited thereupon (the light absorbing layer 103 and the window layer 104) may be chosen from any suitable materials such that the semiconductor substrate becomes transparent with respect to the semiconductor layers. For example, the semiconductor substrate material and the semiconductor layer material laminated on the semiconductor substrate may be InP and $In_{1-x}Ga_xAs_yP_{1-y}$ ($0<x\leq1$, $0<y\leq1$), respectively, as described in the present example.

EXAMPLE 2

Figure 2:
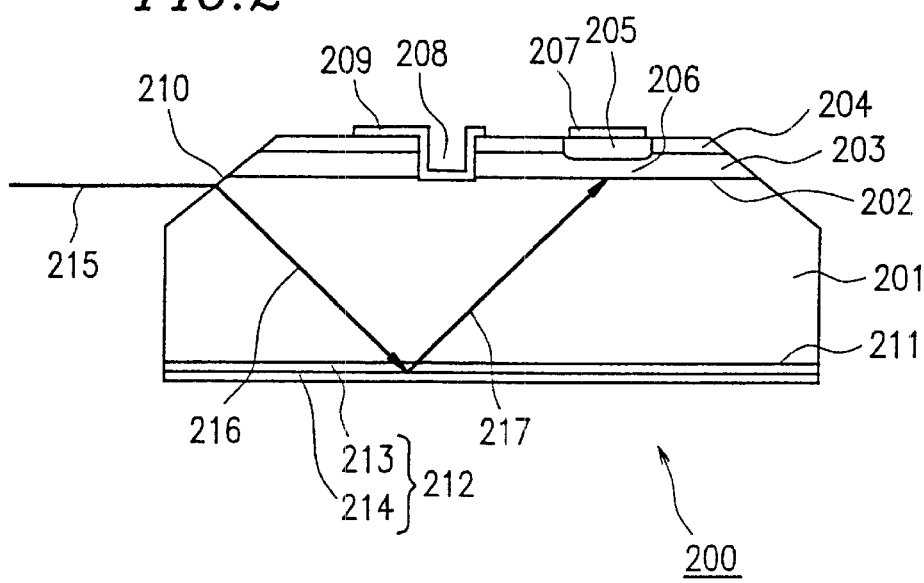
FIG. 2 is a cross-sectional view of a photo detector according to a second example of the present invention.

FIG. 2 shows a cross-sectional view of a photo detector 200 according to Example 2. With reference to FIG. 2, the photo detector 200 includes on the first principal face 202 of an n-type InP semiconductor substrate 201, a low concentration n-type InGaAs light absorbing layer 203, and a low concentration n-type InP window layer 204 in this order. A diffusion area 205 is formed in the window layer 204, by means of diffusing a p-type impurity, e.g., Zn, in an island shape. A portion of the light absorbing layer 203 underlying the diffusion area 205 functions as a photo detection area 206. The photo detection area 206 is electrically connected to a negative electrode 207 through the diffusion area 205. The negative electrode 207 is formed on the diffusion area 205. A portion of the window layer 204 and the light absorbing layer 203 on the first principal face 202 is removed so as to form a contact hole 208, and a positive electrode 209 is formed so as to make contact with the bottom of the contact hole 208. The negative electrode 207 and the positive electrode 209 may be, for example, laminated films of Ti/Pt/Au, and both the electrodes may be simultaneously formed by a lift-off technique. Beveled face 210 is formed on at least one edge portion of the first principal face 202 of the semiconductor substrate 201. A reflector 212 is formed on the second principal face 211 of the semiconductor substrate 201. The reflector 212 is a reflective mirror formed by laminating a metal film 214 of e.g., Al on an insulating film 213 e.g., SiN.

In the photo detector 200 having such a structure, the incident light 215 from the outside of the semiconductor substrate 201 is refracted at the beveled face 210 and enters the interior of the semiconductor substrate 201. The refracted light 216 is reflected from the reflector 212, and then the reflected light 217 enters the photo detection area 206.

In Example 2, as well as in Example 1, the beveled face 210 for refracting the incident light 215 are formed on the first principal face 202. The incident light 215 refracted at the beveled face 210 and entering the interior of the semiconductor substrate 201 is reflected from the reflector 212, and then enters the photo detection area 206. Therefore, according to Example 2, the same effect as in Example 1 is achieved.

Example 2 differs from Example 1 in that both the negative electrode 207 and the positive electrode 209 are formed on the first principal face 202. In such a structure, the photo detector 200 can be bonded to a package by flip-chip bonding. More specifically, the photo detector 200 can be positioned on the base of a package in such a manner that the first principal face 202 faces the package with regard to the second principal face 211, and the negative electrode 207 and the positive electrode 209 are bonded to a predetermined metallic pattern on the wiring substrate. This makes it possible to eliminate the wire bonding process, thereby reducing the parasitic capacitance which may be generated due to such wiring.

Further according to the structure of Example 2, the reflector 212 on the second principal face 211 is not required to function as the positive electrode. Thus, the reflector 212 can be formed as a reflective mirror by laminating the insulating film 213 and the metal film 214, as described above. If a metal film is directly deposited on the semiconductor substrate as in Example 1, the semiconductor and the metal may form an alloy, so that the reflectivity of the reflector may decrease. In Example 2, however, the insulating film 213 is inserted between the semiconductor substrate 201 and the metal layer 214, so that a reflective mirror having a high reflectivity may be obtained.

EXAMPLE 3

Figure 3:
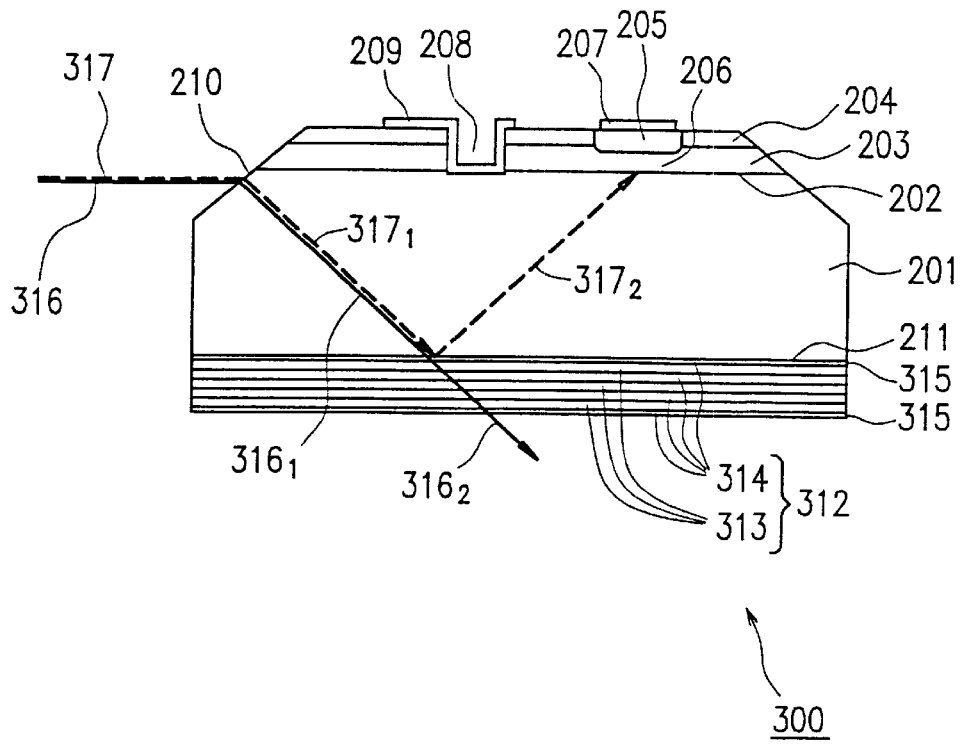
FIG. 3 is a cross-sectional view of a photo detector according to a third example of the present invention.

FIG. 3 is a cross-sectional view of a photo detector 300 according to Example 3. The structure used in Example 3 is basically the same as in the photo detector 200 described in Example 2. Only difference from Example 2 is the structure of the reflector 312 formed on the second principal face 211. In FIG. 3, the same reference numerals denote the same elements as those of the photo detector 200. Example 3 will now be explained mainly with respect to its differences from Example 2.

The reflector 312 also functions as a wavelength filter in which a plurality of films having different levels of indices of refraction are laminated. The reflector 312 is formed by alternately laminating films 313 with a low index of refraction (e.g., $SiO_2$ film having about an index of refraction of 1.45) and films 314 with a high index of refraction (e.g., $TiO_2$ film having about an index of refraction of 2.5). Any known technique may be employed for designing such a wavelength filter 312.

Optical fiber communications may employ multiplexed light of two different wavelengths, e.g., 1.3 μm and 1.55 μm. An example of this will now be explained, in which the wavelength filter 312 is used for separating the spectrum of the multiplexed light of a wavelength of 1.3 μm (the incident light 316) and light of a wavelength of 1.55 μm (the incident light 317), into discrete components based on their wavelengths. In this case, the films 313 are films having a low index of refraction which provide an optical length equivalent to a ¼ wavelength optical path with respect to light having a wavelength of 1.55 μm (where the effect of oblique incidence is considered). The films 314 are films having a high index of refraction which provide an optical length equivalent to a ¼ wavelength optical path with respect to light having a wavelength of 1.55 μm. Furthermore, films 315 can be employed which have a high index of refraction and which provide an optical length equivalent to a ⅛ wavelength optical path with respect to light having a wavelength of 1.55 μm. By alternately laminating the films 313 and the films 314, with the films 315 being employed as the top layer and the bottom layer, a wavelength filter is provided which has a high reflectivity with respect to light having a wavelength of 1.55 μm, and a low reflectivity for light of a wavelength shorter than 1.55 μm. In this structure, however, a sufficiently low reflectivity cannot be obtained for light of a wavelength of 1.3 μm. In such cases, the films 313, 314 and 315 can be redesigned so as to provide the appropriate optical lengths based on a reference wavelength of 1.8 μm instead of 1.55 μm; as a result, the wavelength filter provides a better low reflectivity for light of a wavelength of 1.3 μm. Even if the reference wavelength for the optical length is set at 1.8 μm, the resultant wavelength filter provides a sufficiently high reflectivity for light of a wavelength of 1.55 μm. By using such a wavelength filter for the reflector 312, the following effect can be achieved: when the incident light is multiplexed light of two different wavelengths, i.e., first incident light 316 with a wavelength of 1.3 μm and second incident light 317 with a wavelength of 1.55 μm, the 1.3 μm component of refracted light $316_1$, which is refracted at the beveled face 210, is not so much reflected from the ref lector 312 as transmitted therethrough (as component $316_2$) because the reflector 312 has a low reflectivity for light having a wavelength of 1.3 μm. However, the 1.55 μm component of refracted light $317_1$, which is refracted at the beveled face 210, is mostly reflected from the reflector 312 and reaches the photo detection area 206 (as the reflected light $317_2$) because the reflector 312 has a high reflectivity for light of a wavelength of 1.55 μm.

As described above, according to the present example, the photo detector 300 provides a wavelength selecting function. For example, when the incident light is multiplexed light of two different wavelengths of 1.3 μm and 1.55 μm, the photo detector 300 can selectively detect light of a wavelength of 1.55 μm.

EXAMPLE 4

Figure 4:
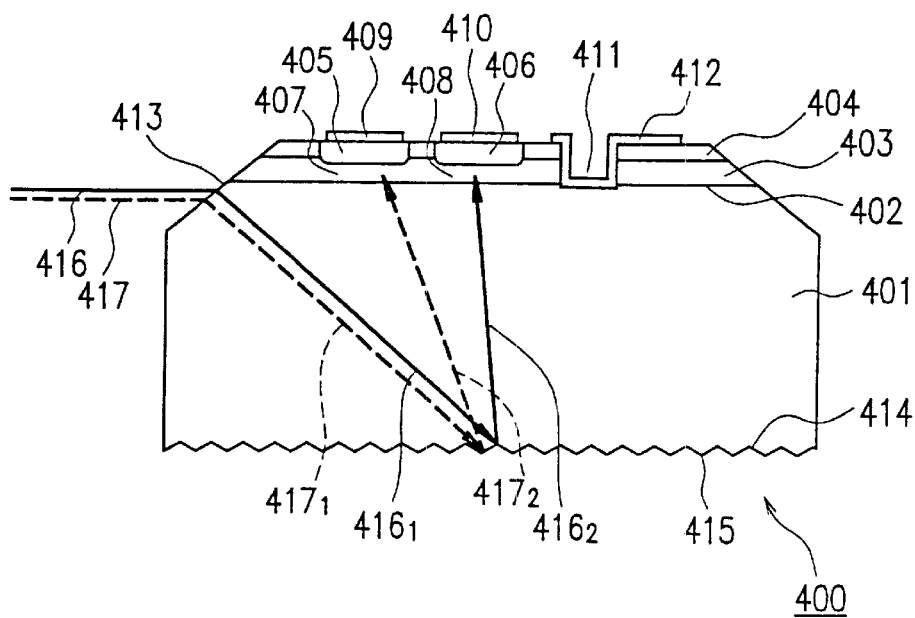
FIG. 4 is a cross-sectional view of a photo detector according to a fourth example of the present invention.

FIG. 4 shows a cross-sectional view of a photo detector 400 according to Example 4. With reference to FIG. 4, a photo detector 400 includes on the first principal face 402 of an n-type InP semiconductor substrate 401, a low concentration n-type InGaAs light absorbing layer 403, and a low concentration n-type InP window layer 404 in this order. A first diffusion area 405 and a second diffusion area 406 are formed in the window layer 404, by means of diffusing a p-type impurity, e.g., Zn, in an island shape. Portions of the light absorbing layer 403 underlying the first diffusion area 405 and the second diffusion area 406 function as a first photo detection area 407 and a second photo detection area 408, respectively. The first photo detection area 407 is electrically connected to a first negative electrode 409 through the first diffusion area 405. The second photo detection area 408 is electrically connected to a second negative electrode 410 through the second diffusion area 406. The first negative electrode 409 and the second negative electrode 410 are formed on the first diffusion area 405 and the second diffusion area 406, respectively. A portion of the window layer 404 and the light absorbing layer 403 is removed from the first principal face 402 so as to form a contact hole 411, and a positive electrode 412 is formed so as to make contact with the bottom of the contact hole 411. The first negative electrode 409, the second negative electrode 410 and the positive electrode 412 are, for example, laminated films of Ti/Pt/Au, and all the electrodes may be simultaneously formed by a lift-off technique. Beveled face 413 is formed on at least one edge portion of the first principal face 402 of the semiconductor substrate 401. A reflector 415 is formed on the second principal face 414 of the semiconductor substrate 401.

In the photo detector 400, the reflector 415 functions as a separator. The reflector 415 is a diffraction grating formed by etching the second principal face 414 of the semiconductor substrate 401.

Methods for manufacturing such a diffraction grating have been established as methods for manufacturing distributed feedback semiconductor lasers. As an example, a diffraction grating will be explained which separates the spectrum of the multiplexed light of two different wavelengths of 1.3 μm and 1.55 μm into discrete components based on the wavelengths. When the diffraction grating is formed with a pitch of 1.5 μm (in terms of optical length), the first incident light 416 of a wavelength of 1.3 μm and the second incident light 417 of a wavelength of 1.55 μm are separated so as to be detected at different photo detection areas.

The spectral separation by such a diffraction grating will be explained more specifically below. The original incident light which is multiplexed light of first incident light 416 and the second incident light 417 is refracted at the beveled face 413 and enters the interior of the semiconductor substrate 401. The angle (refraction angle) formed by the first incident light 416 and the first refracted light component $416_1$ is substantially the same as the angle (refraction angle) formed by the second incident light 417 and the second refracted light $417_1$. When the beveled face 413 is the (112) surface, the angle formed by the first and second refracted light $416_1$, $417_1$ and the first principal face 402 is 41.0°. The first and second refracted light $416_1$, $417_1$, which are refracted and enter the semiconductor substrate 401, are then reflected from the reflector 415. The exiting angle of the primary diffracted light of the first diffracted light $416_2$ and the exiting angle of the primary diffracted light of the second diffracted light $417_2$ differ greatly. The primary diffracted light of the first diffracted light $416_2$ has an angle of −6.4°, and the primary diffracted light of the second diffracted light $417_2$ has an angle of −16.2° with regard to the line perpendicular to the second principal face 414. Therefore, the first diffracted light 416₂ enters mainly the second photo detection area 408, and the second diffracted light 417₂ enters the first photo detection area 407.

As described above, according to Example 4, the photo detector 400 is provided so as to independently and simultaneously detect light components having different wavelengths. The diffracted light which is reflected from the diffraction grating has different exiting angles depending on the wavelength. Therefore, it is possible to select wavelengths to be detected based on the positions of the photo detecting areas. For example, when the incident light is the multiplexed light of two different wavelengths of 1.3 μm and 1.55 μm, the photo detector 400 is provided so as to independently and simultaneously detect light of a wavelength of 1.3 μm and light of a wavelength of 1.55 μm.

Although in Example 4, the first principal face 402 of the semiconductor substrate 401 includes thereon two diffusion areas which are formed in an island-shape, the number of diffusion areas according to the present invention is not limited to this example. Similarly, the photo detector may have more than two diffusion areas which make contact with more than two negative electrodes, respectively. If more than two photo detection areas are formed accordingly, it is possible to separate the incident multiplexed light of more than two wavelengths into discrete components, and detect different wavelength components simultaneously.

EXAMPLE 5

Example 5 illustrates a method for manufacturing a photo detector. FIGS. 5A through 5E are cross-sectional views showing a method for manufacturing the photo detector 200 aforementioned in Example 2. In FIGS. 5A through 5E, the same reference numerals denote the same elements.

Figure 5A:
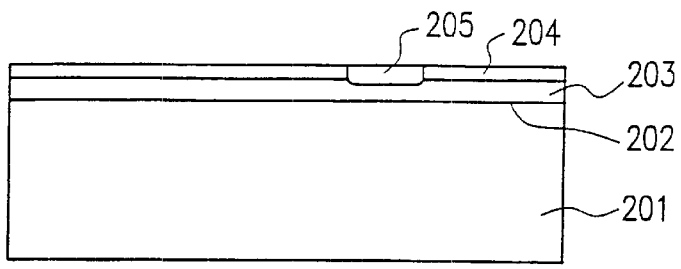
FIGS. 5A through 5E are cross-sectional views illustrating a manufacturing method for a photo detector according to a fifth example of the present invention.

As shown in FIG. 5A, firstly, the low concentration n-type InGaAs light absorbing layer 203 and a low concentration n-type InP window layer 204 are formed by crystal growth on the first principal face 202 of an n-type InP semiconductor substrate 201 in this order. Then, the diffusion area 205 is formed in the window layer 204, by diffusing a p-type impurity, e.g., Zn, in an island shape.

Figure 5B:
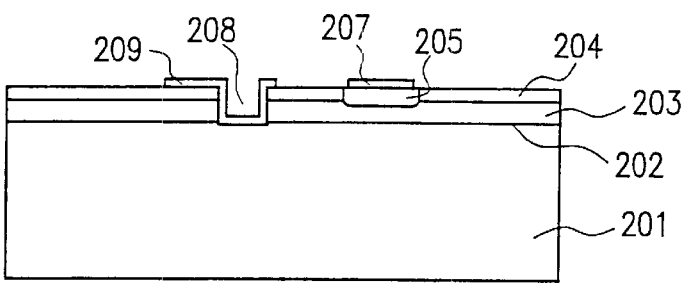

Then, as shown in FIG. 5B, the window layer 204 and the light absorbing layer 203 are partially removed by etching so as to form the contact hole 208. Metal thin films (e.g., laminated films of Ti/Pt/Au) is then deposited or lifted off so as to simultaneously form the negative electrode 207 and the positive electrode 209. The negative electrode 207 is placed on the diffusion area 205, and the positive electrode 209 is formed so as to make contact with the bottom of the contact hole 208.

Figure 5C:
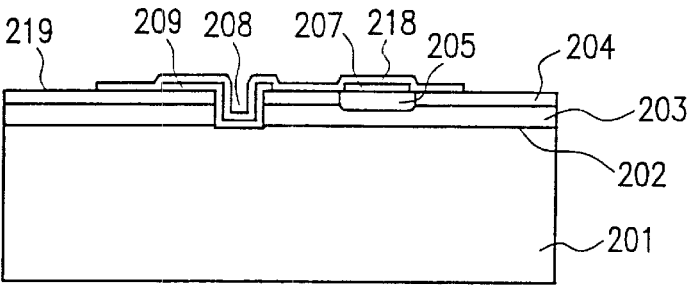

Then, as shown in FIG. 5C, the insulating film 218 (e.g., SiN) is deposited on the upper face of the first principal face 202 of the substrate formed as described above, so as to cover the exposed surfaces of the negative electrode 207, the positive electrode 209, the window layer 204, and the diffusion layer 205. The insulating film 218 is then etched so as to form an opening 219 along the rim of the detector, thereby exposing the window layer 204.

Figure 5D:
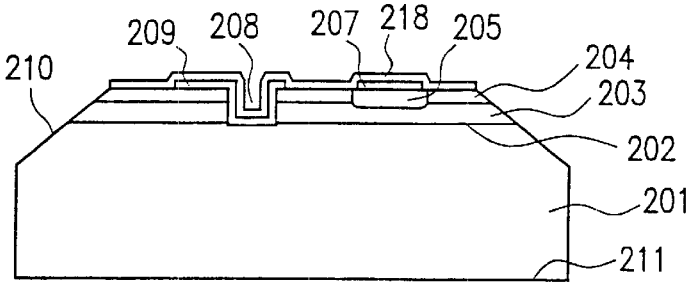

Using the insulating film 218 as a mask, the detector is subjected to an etching using a mixed solution containing hydrochloric acid and nitric acid. As shown in FIG. 5D, this process obliquely removes the semiconductor layer, corresponding to the opening 219, so as to form the beveled face 210.

As in the present example, in the case where the semiconductor substrate 201 is formed of InP and the first principal face.202 is the (001) surface, when the mixed solution for the etching is prepared so as to have an about 5:1 to about 3:1 hydrochloric acid-nitric acid volume ratio, the beveled face 210 can have a precise and specular (112) surface.

Figure 5E:
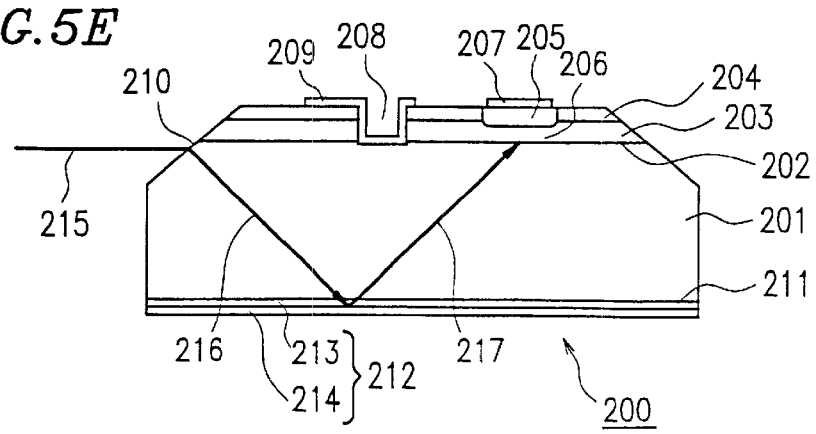
Figure 6:
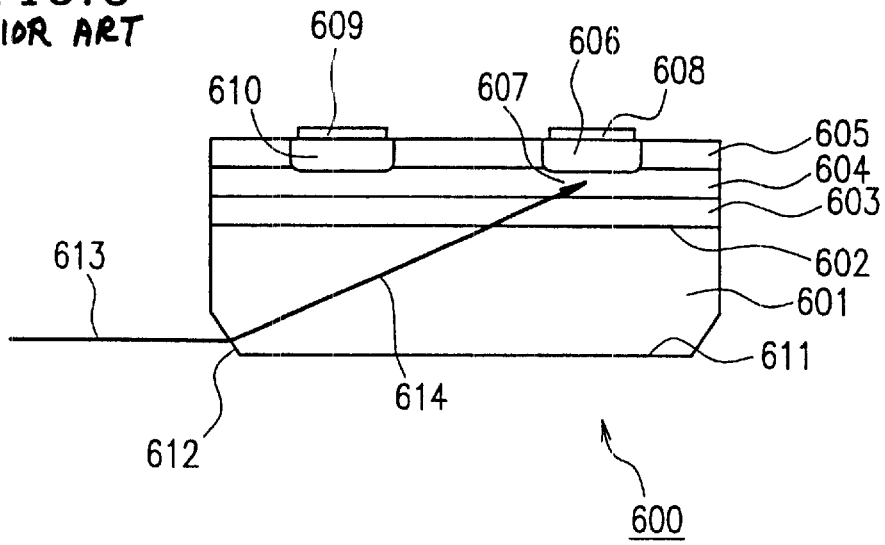
FIG. 6 is a cross-sectional view of a conventional photo detector.
Figure 7:
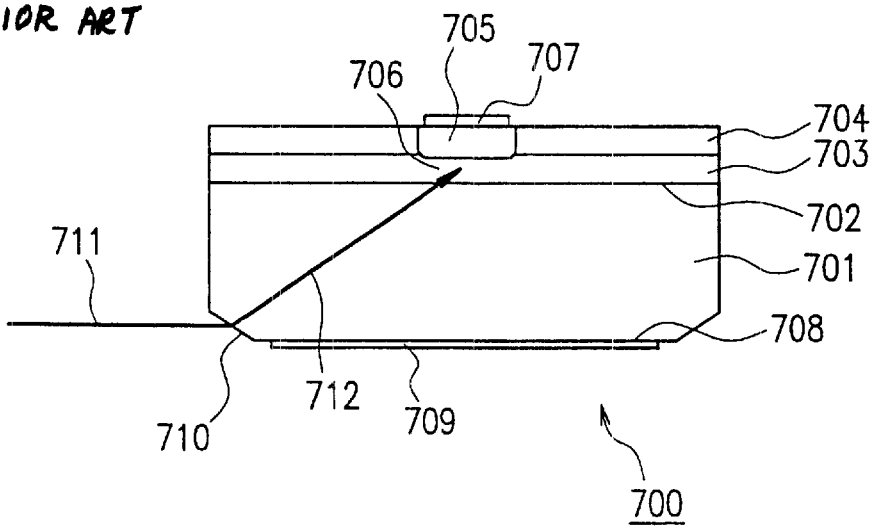
FIG. 7 is a cross-sectional view of another conventional photo detector.

Then, the insulating film 218 is removed. As shown in FIG. 5E, after the thickness of the semiconductor substrate 201 is reduced, the reflector 212 is formed by laminating a insulating film 213 containing, e.g., SiN and a metal film 214 containing, e.g., Al on the second principal face 211, so as to complete the photo detector 200.

According to the manufacturing method of Example 5, it is possible to process the second principal face 211 and the first principal face 202 without requiring relative positioning therebetween. Therefore, there is no need to use a double-side aligner.

Further according to the present example, the entire surface of the second principal face 211 is covered with the reflector 212, which can be made of a metal film. The first principal face 202, which defines the main structure of the photo detector 200, is first formed, and then the thickness of the semiconductor substrate 201 is reduced to about 200 μm or less from the second principal face 211, and finally the second principal face 211 is processed (so as to provide the reflector 212 thereon in this example). As a result, breaks and/or cracks of the thin film wafer during the processing of the second principal face 211 are effectively reduced.

Furthermore, in the case where the first principal face 202 is the (001) surface and the beveled face 210 is the (112) surface, the angle between the beveled face 210 and the second principal face 211 is smaller than in the case where the beveled face 210 is each the (111) surface, and the distance from the incidence side face to the center of the photo detection area becomes shorter. Therefore, it is possible to downsize the chips of the photo detector 200.

Such beveled face 210 having the (112) surface is exposed by etching using a mixed solution containing hydrochloric acid and nitric acid. Specifically, if the solution for the etching is prepared so as to have an about 5:1 to about 3:1 hydrochloric acid-nitric acid volume ratio, the beveled face 210 can be exposed so as to have a precise and specular (112) surface.

According to the present invention, a side-incidence type photo detector in which incident light entering the photo detector from the side direction thereof is refracted and detected at a photo detection area can be provided, where the processing of the second principal face and the first principal face does not require relative positioning therebetween. Therefore, there is no need to use a double-side aligner. Forming a reflective mirror of, e.g., a metal film, on the entire surface of the second principal face, is the only process that needs to be performed on the second principal face. As a result, breaks and/or cracks of the thin film wafer during the processing of the second principal face are effectively reduced.

Furthermore, flip-chip bonding techniques can be used for bonding the first principal face in the wiring substrate. This eliminates the need for wire bonding and reduces parasitic capacitance.

In one example of the present invention, a wavelength filter in which films having different indices of refraction are laminated as a multi-layer can be employed as a reflector. This makes it possible to confer a wavelength selecting function to the photo detector. For example, if the reflector is formed of a wavelength filter having a high index of refraction with respect to the light with a wavelength of 1.55

μm, and having a low index of refraction with respect to the light with a wavelength of 1.3 μm, a photo detector which selectively detects the light of the wavelength of 1.55 μm is obtained.

In another example of the present invention, a reflector includes a diffraction grating which is formed by etching the second principal face of the semiconductor substrate. Diffracted light components reflected from a diffraction grating have different exiting angles depending on their wavelength. Therefore, it is possible to select different wavelengths to be detected based on the positions of the photo detection areas. By providing a plurality of photo detection areas, it is possible to subject the incident multiplexed light of a plurality of wavelengths to spectral separation so as to detect different spectral components simultaneously.

Although the positive electrode is connected to the semiconductor substrate in the exemplary structures of the Examples according to the present invention, it is apparent to those skilled in the art that the present invention is not limited to such structures.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A photo detector, comprising:
   a semiconductor substrate having a first principal face and a second principal face;
   a photo detection area formed on the first principal face of the semiconductor substrate;
   a negative electrode electrically connected with the photo detection area;
   a positive electrode;
   a beveled face formed on at least one edge portion of the first principal face of the semiconductor substrate;
   a reflector formed on the second principal face of the semiconductor substrate,
   a light absorbing layer on the first principal face of the semiconductor substrate;
   a window layer having a diffusion area on the light absorbing layer; and
   a contact hole which reaches the first principal face of the semiconductor substrate through the window layer and through the light absorbing layer;
   wherein incident light from outside of the semiconductor substrate, enters the semiconductor substrate at a side face of the photo detector while being refracted at the beveled face, and thereafter is reflected from the reflector so as to reach the photo detection area.

2. A photo detector of claim 1, wherein the first principal face of the semiconductor substrate is the (001) surface and the beveled face is the (112) surface.

3. A photo detector according to claim 1, wherein the reflector is a reflective mirror comprising a metal film.

4. A photo detector according to claim 3, wherein the reflector functions as the positive electrode.

5. A photo detector according to claim 1, wherein a portion of the light absorbing layer functions as the photo detection area.

6. A photo detector according to claim 5, wherein the photo detection area is electrically connected to the negative electrode through the diffusion area.

7. A photo detector according to claim 6, wherein the positive electrode makes contact with at least a bottom of the contact hole.

8. A photo detector according to claim 1, wherein the reflector is a reflective mirror comprising a laminated structure of a insulating film and a metal film, and the insulating film is disposed between the second principal face and the metal film.

9. A photo detector according to claim 1, wherein the reflector is a wavelength filter in which a plurality of films having respectively different indices of refraction is laminated.

10. A photo detector according to claim 1, wherein the reflector is a diffraction grating.

11. A photo detector according to claim 1, wherein the photo detector comprises a plurality of photo detection areas and a plurality of negative electrodes corresponding to the plurality of photo detection areas, respectively.

12. A photo detector according to claim 1, wherein the beveled face has a specular surface.

13. A photo detector of claim 1, wherein the contact hole is spaced from the diffusion area.

* * * * *